United States Patent [19]

Omata et al.

[11] Patent Number: 4,982,170
[45] Date of Patent: Jan. 1, 1991

[54] SIGNAL PROCESSING APPARATUS

[75] Inventors: Satoshi Omata, Tokyo; Masanori Sakuranaga, Atsugi; Hiroshi Shimizu; Yoko Yamaguchi, both of Tokyo, all of Japan

[73] Assignee: Canon Kabushiki Kaisha, Tokyo, Japan

[21] Appl. No.: 330,825

[22] Filed: Mar. 30, 1989

[30] Foreign Application Priority Data

Apr. 1, 1988 [JP] Japan .................. 63-81941

[51] Int. Cl.$^5$ .......................... H03C 1/00; H03C 3/00
[52] U.S. Cl. ...................................... 332/144; 332/149
[58] Field of Search ............... 332/144, 145, 149, 151, 332/176; 331/2, 50, 55

[56] References Cited

U.S. PATENT DOCUMENTS

| | | | |
|---|---|---|---|
| 4,297,649 | 10/1981 | Sbuelz et al. ...................... | 331/55 X |
| 4,521,745 | 6/1985 | Falconer ................................... | 331/2 |
| 4,710,964 | 12/1987 | Yamaguchi et al. .................. | 382/17 |

FOREIGN PATENT DOCUMENTS 60-134391 7/1985 Japan .
61-127075 6/1986 Japan .
61-127076 6/1986 Japan .
62-103773 5/1987 Japan .

OTHER PUBLICATIONS

"Entrainment of Two Coupled van der Pol Oscillators by an External Oscillation", in Biological Cybernetics, vol. 51, pp. 225–239 (1985), Ohsuga et al.
"Pattern Recognition Based on Holonic Information Dynamics: Towards Synergetic Computers", in Complex Systems-Operational Approaches in Neurobiology, Physics and Computers, ed. H. Haken, pp. 225–239 (1985), Shimizu et al.
"Principle of Holonic Computer and Holovision" in Journal of the Institute of Electronics, Information and Communication, vol. 70, No. 9, pp. 921–930 (1987), Shimizu et al.
"Holonic Model of Motion Perception", IEICE Technical Reports, 3/26/88, pp. 339–346, Omata et al.
"Entrainment Among Coupled Limit Cycle Oscillators With Frustration", in Physica D, vol. 31, No. 3, pp. 397–408, 7/88, Omata et al.

Primary Examiner—David Mis
Attorney, Agent, or Firm—Fitzpatrick, Cella, Harper & Scinto

[57] ABSTRACT

This invention discloses a signal processing apparatus which has N nonlinear oscillators, a circuit for coupling the N nonlinear oscillators in a loop-like form, a circuit for shifting the phase of the output signal of a particular nonlinear oscillator from among the N nonlinear oscillators in correspondence with an input signal, and a circuit for outputting the output of at least one oscillator of the N nonlinear oscillators as the output of the signal processing apparatus. This apparatus has capability to effect analog conversion, modulation or storage of an input signal.

7 Claims, 11 Drawing Sheets

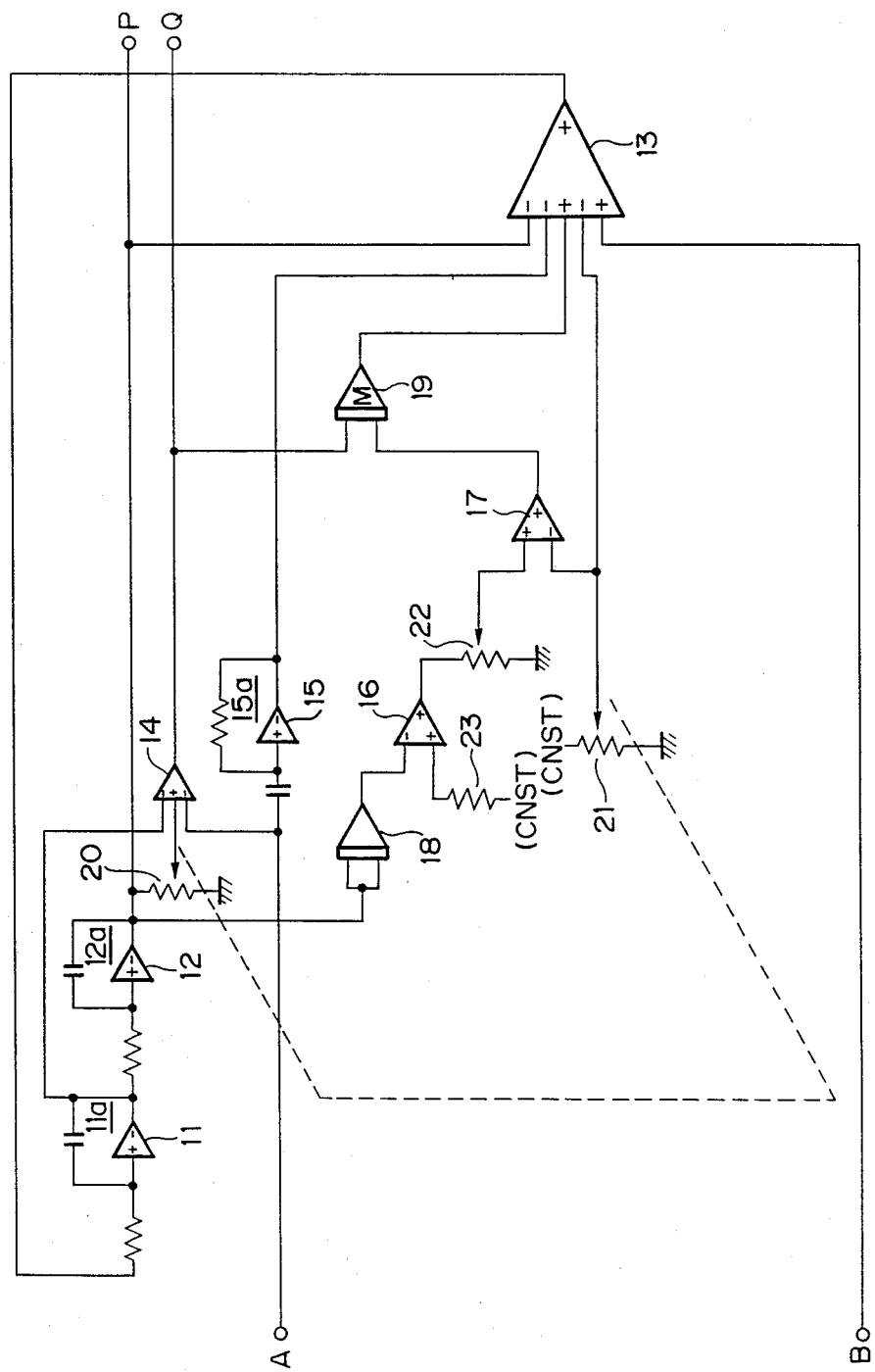
F I G. 3

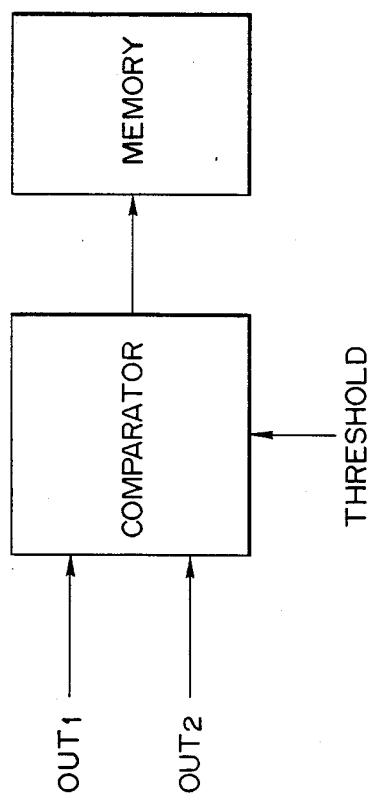

SIGNAL PROCESSING APPARATUS

BACKGROUND OF THE INVENTION

1. Field of the Invention

The present invention relates to a signal processing apparatus and, more particularly, to a signal processing apparatus arranged to convert, modulate, or store an input signal by performing analog signal processing of the input signal.

2. Description of the Related Art

In a wide range of industrial applications, there have recently been demands for systems to perform pattern recognition, such as, feature extraction from a large amount of input data. If complicated recognition patterns must be processed, computers may be substituted for skilled experts who heretofore made decisions as to which recognition patterns are to be processed. However, complex programs must be developed for this purpose and the scale of its data base must be tremendously increased and hence the necessity for memories for data storage becomes a serious factor. In addition, the design of such apparatus becomes complicated and the manufacturing cost increases accordingly as expected.

In such a situation, it is desirable to develop an expert information processing system which does not completely depend upon binary arithmetic-logic operations widely used in modern digital computers and which incorporates a novel signal processing system, in addition one which can be adapted to high-grade image processing and enables reductions in programming and data storage requirements. In recent years, devices or architectures for computers which simulate the processing mechanism of a neural system of a living body have attracted attention as one type of expert information processing system. A typical example is an information processing apparatus which employs a system constituted by coupling of nonlinear oscillators.

For example, Japanese Patent Laid-open No. 61-127075 proposes to convert an object to be recognized into the frequency of an oscillator system so as to define the object. Japanese Patent Laid-open No. 60-134391 discloses a pattern frequency converting apparatus which comprises a system in which nonlinear oscillators are arranged in a two-dimensional binary plane, and the apparatus is designed to have the nonlinear oscillators correspond to the "1" bits of an input pattern to compute a frequency of the system, thereby converting the input pattern into a frequency. Japanese Patent Laid-open Nos. 61-127076 and 62-103773 (which are patent applications on which U.S. Pat. No. 4,710,964 is based) disclose pattern recognition apparatus. Japanese Patent Application Laid-open Nos. 61-127076 and 62-103773 propose an apparatus for performing pattern recognition in a manner similar to the memory process and the information processing process of the brain of a living thing by utilizing the two functions of a nonlinear oscillator circuit, that is, an information processing function based on interference, in which an oscillation mode before interference strongly influences an oscillation mode after the interference and a memory function in which an oscillation pattern which has undergone interference can be maintained thereafter. In particular, in such a pattern recognition apparatus, the complexity of software and hardware becomes extremely low, since it depends upon the category in which the object is to be recognized, thus the design of the apparatus becomes easy and the reliability of the apparatus becomes high.

The aforementioned signal processing employs nonlinear oscillators according to the related art and adopts the so-called "entrainment" method as a self-organizing basic mode for signal conversion. Entrainment is a phenomenon in which a plurality of nonlinear oscillators which are coupled to one another interact reciprocally to deviate their frequencies from their respective basic frequencies, so that the nonlinear oscillators oscillate reciprocally. The phenomenon of entrainment by interference between nonlinear oscillators which are coupled to one another is explained in, for example, "Entrainment of Two Coupled Van der Pol Oscillators by an External Oscillation" (Bio. Cybern. 51,325-333(1985)).

Signal processing which makes use of the "entrainment" of oscillation in the nonlinear oscillator system utilizes, as its basic operating principle, the nature in which oscillations whose phase difference is small tends to strengthen their amplitudes reciprocally, while oscillations whose phase difference is large tends to weaken their amplitudes reciprocally. In other words, in the aforesaid related arts, whether or not entrainment has occurred is determined on the basis of amplitude of the signal, and the result is obtained as a binary output. More specifically, in each of those related arts, a binary input signal is converted into the magnitude of phase difference between nonlinear oscillators, and whether or not entrainment has occurred is represented in a binary manner on the basis of a comparison between two states, one being represented by the amplitude of oscillation having increased after mutual interference, and the other represented by the amplitude of oscillation having decreased after mutual interference.

This type of oscillation phenomenon, that is, "entrainment" of oscillation is the result of mutual interference between oscillators which takes place because the phase of each individual nonlinear oscillator is inseparably related to the amplitude of the oscillation. In other words, the differences of the phase and amplitude of the oscillation before and after "entrainment" can have an analog relationship or some other relationship, but not merely a conversion relationship. Accordingly, the signal processing capability of the nonlinear oscillator system is not sufficiently utilized only by using the amplitude of oscillation of a nonlinear oscillator system on a binary basis only. The foregoing is the starting point from which is derived the problem to be solved by the present invention.

It is not the intent to dynamically change parameters defining the oscillation of a non-linear oscillator in the above-described conventional signal processing method. For example, two non-linear oscillators are connected with fixed parameters to mutually interfere, and the state of the oscillator system has been uniformly determined by the term of the states of the two oscillators and the fixed parameters.

These problems lead to a drawback, i.e., if information processing such as pattern recognition is carried out using nonlinear oscillators which are coupled to one another in the conventional manner aforementioned, the signal processing potential of the system is limited to a high degree. More specifically, according to the related arts described above, an input signal which originally contains a large amount of information is converted into two simple binary states. One state wherein the amplitude of oscillation is large and the other state wherein the amplitude of oscillation is small, by means of the entrainment phenomenon in the nonlinear oscillator circuit. As a result, amplitude and phase which can be used as a signal carrier containing various kinds of information are restricted to simple binary form.

SUMMARY OF THE INVENTION

It is, therefore, an object of the present invention to provide a signal processing apparatus which has a novel structure and whose processing capability is far superior to that of a conventional type of signal processing apparatus.

It is another object of the present invention to provide a signal processing apparatus which has a novel structure capable of converting, modulating, switching, or storing an input signal in an analog manner.

It is another object of the present invention to provide a signal processing apparatus capable of extracting the largest possible amount of information contained in an input signal so that the amplitude and the phase of an output oscillation wave may be fully used as a signal carrier.

To achieve the above objectives, in accordance with the present invention, there is provided a signal processing apparatus characterized by N nonlinear oscillators, coupling means for coupling the N nonlinear oscillators in a loop-like form, shifting means for shifting the phase of the output signal of a particular nonlinear oscillator from among the N nonlinear oscillators in correspondence with an input signal, and outputting means for outputting the output of at least one oscillator of the N nonlinear oscillators as the output of the signal processing apparatus.

The signal processing apparatus having the abovedescribed construction is free from the disadvantage of the state of "entrainment" being utilized in a binary only manner as in the conventional type of nonlinear oscillator system. In addition, the use of mutual interference in oscillation among the N nonlinear oscillators makes it possible to convert the analog phase shift executed by the shifting means in accordance with the input signal into the analog magnitudes of the amplitude and the phase of oscillation, thereby enabling the analog signal to be used as a signal carrier. It is also possible to add a function to perform switching of phase and amplitude, where switching utilizes multi-stable states of an oscillator system. In addition, it is possible to execute an analog sequence process operation or storage operation, where such operation utilizes a hysteresis in which the oscillator system reflects the state thereof prior to inputting the input signal.

One feature of the present invention is a nonlinear oscillator constituted by a Van der Pol oscillator circuit.

Another feature of the present invention is that, if the amount of phase shift is represented by $\phi_{ij}$, then $$\sum_{i=1}^{N} \phi_{i,i+1} \neq 2n\pi, \text{ or } \sum_{i=2}^{N+1} \phi_{i,i-1} \neq 2n\pi$$

(where $n$ is an integer number)

Still another feature of the present invention is that, if the signal processing apparatus is provided with comparing means for comparing an output signal from the output means with a predetermined threshold and then for providing a binary output, the entire nonlinear oscillator system can serve as, not only, an analog memory device but also a digital memory device.

Yet another feature of the present invention is that the coupling means includes altering means for altering the strength of the coupling between the nonlinear oscillators, the characteristics of modulation or conversion of the signal processing apparatus being controlled by altering the strength by means of the altering means.

BRIEF DESCRIPTION OF THE DRAWINGS

FIG. 3 is a schematic diagram showing the construction of one of the Van der Pol nonlinear oscillator circuits used in the present embodiment of the signal processing apparatus;

FIG. 10 is a block diagram showing a portion of a memory device in which the signal processing apparatus according to the present invention is utilized as a digital memory.

DESCRIPTION OF THE PREFERRED EMBODIMENTS

BASIC CONSTRUCTION OF THE EMBODIMENTS

A feature common to a nonlinear oscillator circuits is that since the next state of the circuit is determined by a combination of the inner state of the circuit and an external input at each instant of time, an oscillation wave of complex form can be stably generated.

An apparatus of the present invention is constituted by a plurality of nonlinear oscillator circuits, specifically, Van der Pol nonlinear oscillator circuits, which are coupled to one another. It is well known that a Van der Pol oscillator circuit is assembled with resistors, capacitors, induction coils, and negative resistance devices such as Esaki diodes.

The behavior of the Van der Pol nonlinear oscillator circuit can be expressed in differential equation. For a system consisting of a plurality of oscillators (or oscillator circuits), if the i-th oscillator is oscillating without being influenced by any other oscillators and an external input, that is, if the nonlinear oscillators are isolated from one another in the system, the behavior of the i-th oscillator is represented in the form $$Xi = Yi \tag{1}$$

$$\dot{Y}i = -Xi + k(1 - Xi^2) \cdot Yi \tag{2}$$

where Xi and Yi are variables, "." represents differentiation with respect to time (dXi/dt), and k is the constant determined by the elements in the nonlinear oscillator circuit.

Figure 1:
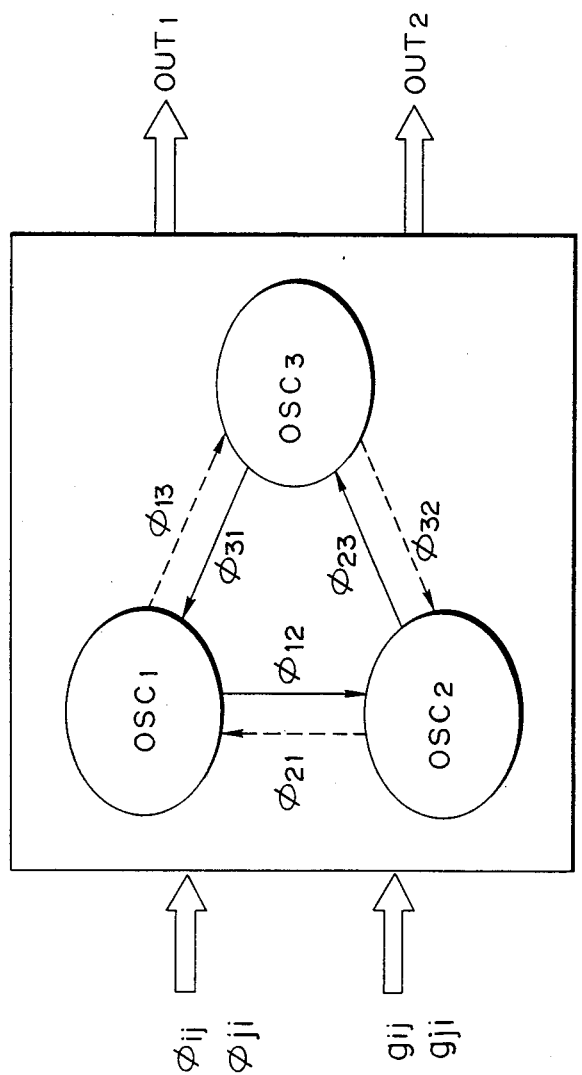
FIG. 1 is a general diagram which serves to illustrate the concept of a basic embodiment of the present invention.
Figure 4:
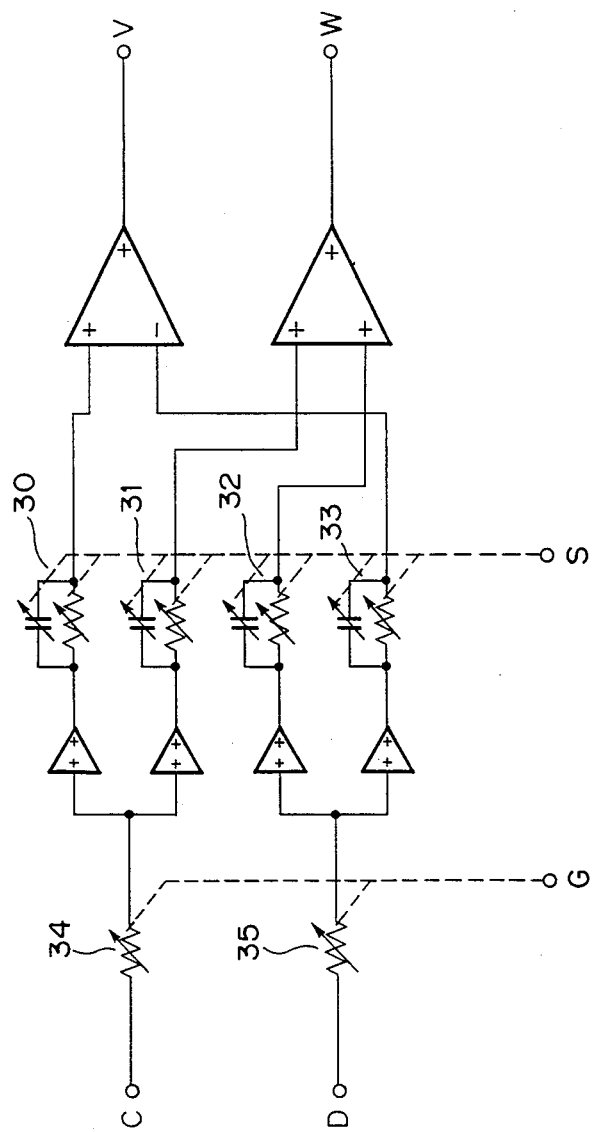
FIG. 4 is a circuit diagram showing the construction of a phase shift circuit for shifting the phase of oscillation as is used in the present embodiment of the signal processing apparatus.

FIG. 1 shows an example of a construction of a signal processing apparatus consisting of an oscillator system including a combination of three oscillator units each of which produces the above-described oscillation. The illustrated signal processing apparatus receives signals $\phi ij$ and $\phi ji$, and signals gij and gji from an external circuit, then performs conversion or modulation of these input signals, and provides output signals OUT1 and OUT2. The input $\phi ij$ represents a shift amount given to the phase of the output signal of the i-th oscillator, and also represents that the shifted output of the oscillator is input to the j-th oscillator. The input gij represents the strength of coupling between the i-th and j-th oscillators when the i-th oscillator output is coupled to the input of the j-th oscillator. In the embodiments which will be described later, a phase shift circuit which performs the phase shift function of $\phi ij$, such as shown in FIG. 4, is provided to connect OSCi and OSCj. The phase shift circuit shifts the output of OSCi by $\phi ij$ and provides the shifted output to OSCj. It should be noted that between the i-th and j-th oscillators an equation $\phi ij \neq \phi ji$ or $gij \neq gji$ may hold. These inputs will be described later. Although the number of nonlinear oscillators is three for the sake of simplicity of explanation, the present invention is not limited solely to the system using three nonlinear oscillators.

Referring to FIG. 1, the illustrated oscillation system is configured with three nonlinear oscillators OSCi (i=1, 2 and 3) and the "couplings" between these nonlinear oscillators OSCi for causing their output oscillation waves to interfere with each other. In the present invention, the "coupling" between the two nonlinear oscillators OSCi and OSCj serves to separately shift the phase of the output signal of each individual nonlinear oscillator and to physically couple these nonlinear oscillators. The phase shift and the physical coupling may be carried in the embodiment by means of the phase shift circuit, which will be described later. By adjusting the external inputs, that is, the amount $\phi ij$ of phase shift and the coupling parameter gij, it is possible to arbitrarily set the degree or the mode of interference between the nonlinear oscillators.

The above equations (1) and (2) are motion equations which represent the behavior of isolated nonlinear oscillators. The behavior of nonlinear oscillators which interfere with each other will now be described.

The phase Pj of the output signal of the j-th nonlinear oscillator OSCj is shifted by an angle of $\phi j, i$ in response to a signal indicative of the amount $\phi ij$ of phase shift supplied from the exterior, and the output of the j-th oscillator is applied to the i-th nonlinear oscillator OSCi as an interference input. At this time, the behavior of the i-th oscillator is expressed as:

$$Xi = Yi + \sum_j \gamma ji (Xj \cdot \cos\phi ji - Yj \cdot \sin\phi ji) \tag{3}$$

$$\dot{Y}i = -Xi + k(1 - Xi^2) \cdot Yi + \sum_j \gamma ji \cdot (Xj \cdot \cos\phi ji + Yj \cdot \sin\phi ji) \tag{4}$$

where the second term on the right-hand side of of the above equation (3) and the third term on the right-hand side of the above equation (4) are terms each of which represents interference between the oscillators and $\gamma ji$ is a constant which is determined by setting a coupling parameter. If the coupling parameter $\gamma ji$ is "0", it means that the nonlinear oscillators are not physically coupled to one another. The embodiment apparatus of FIG. 1 is arranged such that the amount $\phi ji$ of phase shift independently varies by 0 to $2\pi$ according to the external setting, such that the ratio assumed by the strength of coupling can be arbitrarily varied according to the setting of the coupling constant $\gamma ji$.

If it is assumed that the extent of the nonlinearity of each oscillator is small, the behavior of the oscillator can be approximated by the following equations $$Xi = Ai \cos(t - Pi)$$

$$Yi = -Ai \cos(t - Pi)$$

Thus, it is possible to obtain the amplitude Ai and the phase Pi of each oscillator. In this case, if the behavior of the oscillator OSCi is expressed by using the amplitude Ai and the phase Pi, the following equations (5) and (6) are obtained $$\dot{A}i = d \cdot Ai - e \cdot Ai^3 + \sum_j \{gji \cdot \cos(\phi ji + Pj - Pi)\} \tag{5}$$

$$\dot{P}i = \sum_j \{gji \cdot (Aj/Ai) \cdot \sin(\phi ji + Pj - Pi)\} \tag{6}$$

where d=k/2, e=k/8, and gji=$\gamma ji$, with gji representing a signal which has the same meaning as gji shown in FIG. 1.

The apparatus shown in FIG. 1 further includes means (in this embodiment, a phase shift circuit such as that shown in FIG. 4) for shifting the phase of the output of an oscillator so that the phase may lag or lead and for connecting all the oscillators in a loop-like configuration to deliver the output of an arbitrary nonlinear oscillator to the next connected oscillator, thereby causing interference of similar nature.

A theoretical examination of the relationship between external inputs $\phi 12$, $\phi 23$ and $\phi 31$ and the behavior of the oscillator systems resulted in the following finding. More specifically, in the case of the nonlinear oscillation system shown in FIG. 1, if $\phi 12 + \phi 23 + \phi 31 = 2n\pi$, and $\phi ij \neq \phi ji$ (n: arbitrary integer)

then, the oscillation system, after interference, assumes a "consistent" state. On the other hand, if $\phi 12 + \phi 23 + \phi 31 \neq 2n\pi$, or $\phi 21 + \phi 32 + \phi 13 \neq 2n\pi$ then, the oscillation system, after interference, assumes a "frustrated" state.

When all the nonlinear oscillators are coupled in a loop-like form, the output of the oscillator OSC1 is applied to the oscillator OSC2 as an interference input, the output of the oscillator OSC2 to the oscillator OSC3 as an interference input, and the output of the oscillator OSC3 to the oscillator OSC1 as an interference input. In other words, the output of the oscillator OSC1 is input to the other nonlinear oscillators to cause interference in each of them while passing around the loop, and the output finally returns to the input of the oscillator OSC1. If this oscillator system is in the "consistent" state, the phase difference between the input and the output of the oscillator OSC1 can be represented by an integral multiple of $2\pi$ (including zero) from the above equation. Therefore, even if interference is transmitted from one nonlinear oscillator to another and is thus passed around the loop, and if $\phi ij$ set externally equals to the phase difference between i-th and j-th oscillator outputs, the entire oscillator system remains in the stable "consistent" state. However, if $$\phi 12+\phi 23+\phi 31\neq 2n\pi, \text{ or}$$

$$\phi 21+\phi 32+\phi 13\neq 2n\pi$$

then, when the output of the oscillator OSC1 passes around the loop and is applied to the input of the oscillator OSC1, the output of the oscillator OSC1 is further shifted and this shifting is transmitted around the loop of FIG. 1. Such a state is the "frustrated" state mentioned above. As will be described in detail later, if an input signal to be modulated or converted is converted into the amount $\phi ji$ of phase shift and this amount $\phi ij$ is then input to the nonlinear oscillator system shown in FIG. 1, the stable state of oscillation of the oscillator system varies in an analog manner according to the amount $\phi ji$ of phase shift. In other words, the state of oscillation of the oscillator system varies in an analog manner through the intermediary of $\phi ij$ in accordance with the input signal. Accordingly, if the output of any one of the nonlinear oscillators of the oscillator system is extracted as the output of the entire system, it follows that modulation or conversion of the input signal is achieved.

Figure 2:
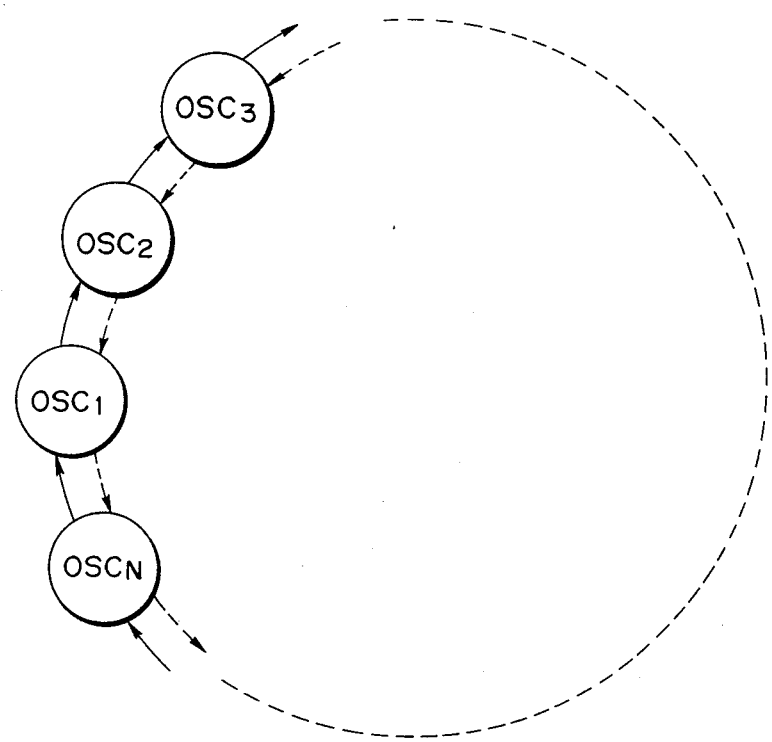
FIG. 2 is a general diagram which serves to illustrate the basic concept of the present invention.

In order to extend the above discussion to a general case, FIG. 2 will be referred to. As shown in the block diagram of FIG. 2, N nonlinear oscillators are coupled to constitute a closed loop and the individual oscillators are numbered clockwise. It is assumed here that there is provided means for supplying the amount $\phi ji$ of phase shift to the oscillator system from the exterior so that the phase difference $\phi ij$ in the couplings between adjacent nonlinear oscillators $\phi ij$ may satisfy $$\sum_{i=1}^{N} \phi i,i+1 \neq 2n\pi, \text{ or } \sum_{i=2}^{N+1} \phi i,i-1 \neq 2n\pi, \quad (7)$$

where $N$ = number of oscillator.

The nonlinear oscillators of the oscillator system are loop-coupled, an nonlinear oscillator of $i=N+1$ corresponds to an nonlinear oscillator of $i=1$ in the above expression.

In such a setting, for the amplitude Ai and the phase Pi of each nonlinear oscillator, if the phase shift input $\phi ij$ is set so as to obtain $$\sum_{i=1}^{N} \phi i,i+1 = 2n\pi, \text{ and } \sum_{i=2}^{N+1} \phi i,i-1 = 2n\pi \quad (8)$$

that is, if the phase of the output of the i-th nonlinear oscillator OSCi is shifted by an angle $\phi ij$ and the shifted output is input to the j-th nonlinear oscillator OSCj, then the phase difference Pj−Pi between each nonlinear oscillator in the oscillator system after interference equals $\phi ij$. Thus, $$Pi-Pj=\phi ji, \text{ or } Pj-Pi=\phi ij \quad (9)$$

However, if equation (7) holds $$\sum_{i=1}^{N} \phi i,i+1 \neq 2n\pi, \text{ or } \sum_{i=2}^{N+1} \phi i,i-1 \neq 2n\pi$$

then, for any value of i and j, the phase difference Pi−Pj between i-th and j-th nonlinear oscillators after interference cannot become $$Pi-Pj=\phi ji \quad (10)$$

More specifically, the following case occurs $$Pi-Pj\neq \phi ji \quad (11)$$

This state corresponds to the "frustrated" state of an oscillator system.

It has heretofore been believed without any theoretical basis that the coupling between each oscillator shown in FIG. 1 or 2 brings about unpredictable oscillation in the circuit. This is because any theoretical examination has not been tried since the law of values which are taken on by the amplitude Ai and the phase Pi is unknown.

In such a situation, the present disclosure shows an additional circuit for setting the phase difference between each nonlinear oscillator and uses this circuit to set the phase of the output of each nonlinear oscillator so that the phase may lag or lead, thereby setting the phase difference between each nonlinear oscillator to the desired amount. In consequence, it was discovered that a certain law exits which governs the amplitude Ai and the phase Pi of the oscillation of the nonlinear oscillator which is placed in the "frustrated" state due to interference between the nonlinear oscillators. According to the findings, the present embodiment provides a law utilized for a signal processing apparatus.

In accordance with the present invention, it is possible to extract the output waveform (Xi, Yi) of any oscillator in the oscillator system as the output of the signal processing apparatus. In addition, an input signal may be the amount $\phi ji$ of phase shift which is externally set, coupling strength which is externally set, or an oscillation waveform which is externally applied.

Oscillator Unit

FIG. 3 shows a general example of an oscillator which constitutes a part of an oscillator unit, and FIG. 4 shows a general example of a phase shift circuit (SHFT) which constitutes a part of the oscillator unit. In the following description, the term "oscillator" represents the nonlinear oscillator shown in FIG. 3, the term "phase shift circuit" represents the circuit shown in FIG. 4, and the term "oscillator unit" represents a combination of the circuits of FIGS. 3 and 4, and an adder such as is denoted by a symbol "+" in FIG. 5, as will be described later.

In FIG. 3, reference numerals 11 to 17 denote operational amplifiers and symbols + and − represent the polarities of the input and output signals of each corresponding operational amplifier 11 to 17. Each of the operational amplifiers 11 and 12 are connected to corresponding illustrated resistors and capacitors to constitute an integrator 11a or 12a. The operational amplifier 15 is connected to corresponding resistors and capacitors to constitute a differentiator 15a. Each of the other operational amplifiers 13, 14, 16 and 17 is connected to corresponding illustrated resistors and capacitors to constitute an adder.

Multipliers 18 and 19 as well as variable resistors 20 to 22 are used, and the variable resistors 20 and 21 are arranged to operate in an interlocked relationship. When an appropriate level of positive voltage is applied to the circuit via a resistor 23, the amplitude of oscillation increases, while if a negative voltage is applied to the same resistor, the amplitude of oscillation decreases. In this circuit arrangement, input signals are applied to terminals A and B, and output signals are provided at terminals P and Q.

This oscillator generates its basic oscillation by means of a feedback circuit comprised of the operational amplifiers 11, 12 and 13. The remaining portion serves as a Van der Pol oscillator circuit for generating nonlinear oscillation characteristics.

Several such oscillator circuits are used and, if the oscillator circuits are connected to each other through the phase shift circuit shown in FIG. 4, the oscillator system shown in FIG. 1 can be constructed. In other words, a single oscillator unit, that is, each oscillator OSC of FIG. 1 or 2 can be constructed by the Van der Pol oscillator of FIG. 3 and the phase shift circuit of FIG. 4. The phase shift circuit shown in FIG. 4 has variable resistors 34, 35 and four integrating circuits 30, 31, 32, 33 as well as two adders. As the variable resistor 34 (35) changes, signals input to terminals C (D) are amplified and provided at a terminals V (W). When the integrating circuits 30 to 33 are adjusted, the phase difference between the input signal of the terminal C (D) and the output signal of the terminal V(W) changes.

Figure 5:
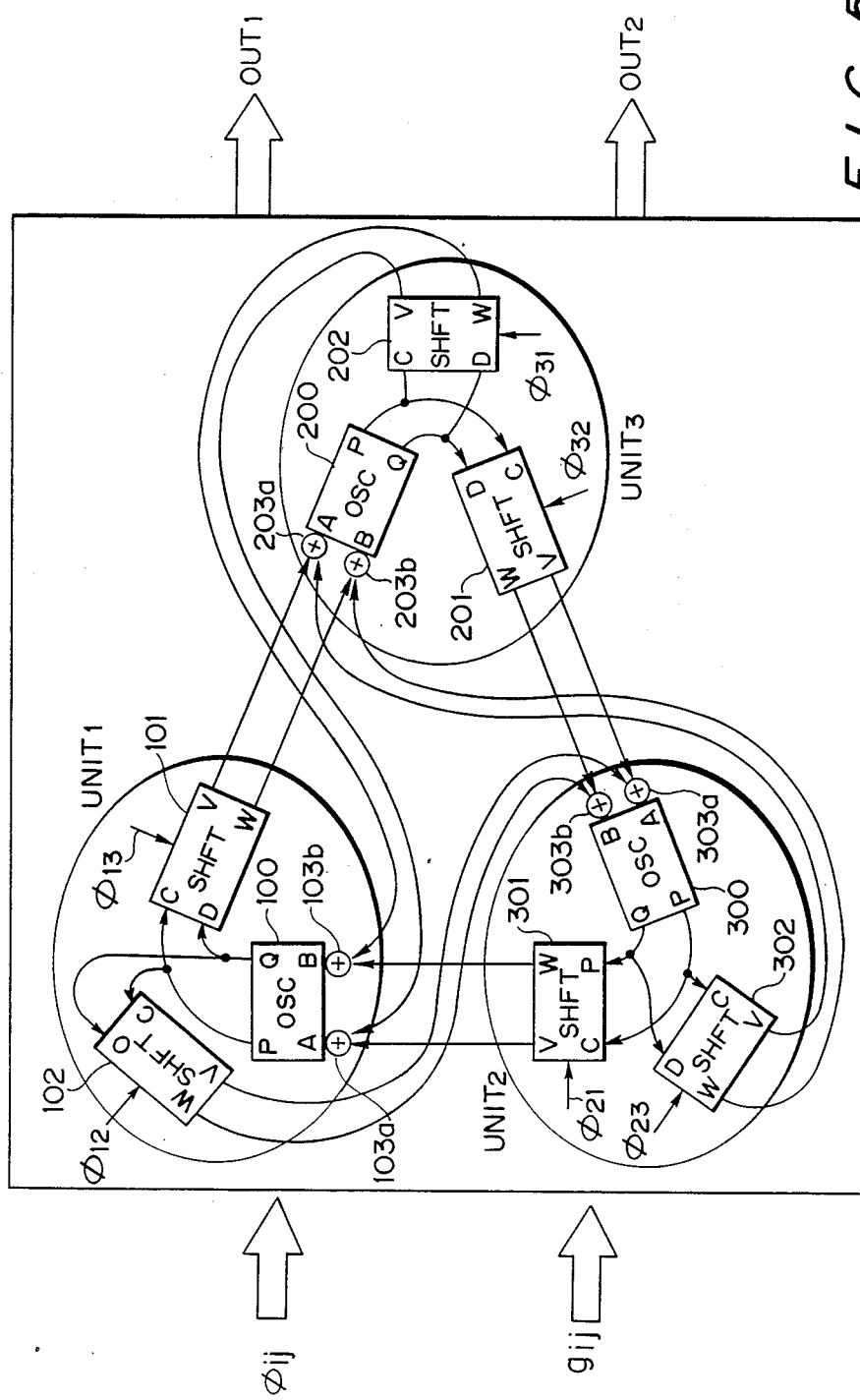
FIG. 5 is a conceptual view of the present embodiment of the signal processing apparatus which is modeled in such a manner that the oscillators of FIG. 3 and the phase shift circuit of FIG. 4 are incorporated in the apparatus of FIG. 1.

In order to construct the nonlinear oscillator system shown in FIG. 1 by a combination of the Van der Pol oscillator shown in FIG. 3 and the two phase shift circuits, wiring such as that shown in FIG. 5 is adopted. As shown in FIG. 5, in oscillator unit UNIT1, signals from the terminals P and Q of oscillator circuit 100 are respectively input to the terminals C and D of phase shift circuits 101, 102 and, the terminals V and W of the phase shift circuits 101, 102 are connected to the input terminals A and B of the oscillators 200, 300 of adjacent nonlinear oscillator units (UNIT2, UNIT3) via adders (203a, 203b, 303a and 303b) denoted by "+". More specifically, in FIG. 5, where the entire oscillator system is "frustrated", a "clockwiseinputting", that is, UNIT1→UNIT3→UNIT2→UNIT1 is represented by:

$$\sum_{i=2}^{N+1} \phi_{i,i-1} \neq 2n\pi$$

and an "anti-clockwise inputting", that is UNIT1-→UNIT2→UNIT3→UNIT1, is represented by:

$$\sum_{i=1}^{N} \phi_{i,i+1} \neq 2n\pi$$

As previously described, if the above relations simultaneously hold, the entire oscillator system is in the "frustrated" state. In accordance with FIG. 5, the above two way relations can be obtained by the following wiring: UNIT1 has a oscillator circuit 100, two phase shift circuit 101, 102 and two adders 103a, 103b denoted by "+". The shift amounts performed by the two phase shift circuits 101, 102 are $\phi 12$ and $\phi 13$, respectively. The P, Q outputs of the oscillator of UNIT1 are coupled to two pairs of C,D inputs of the two phase shift circuits 101, 102 respectively. The V, W outputs of phase shift circuit 102 are input into the oscillator 300 of UNIT2 via adders 303a, 303b. The other inputs of adders 303a, 303b are from the phase shift circuit 201 of UNIT3. In addition, the V, W outputs of phase shift circuits 101 of UNIT1 are input into the oscillator 200 of the UNIT3 via adders 203a, 203b denoted by "+". The other inputs of adders 203a, 203b are from phase shift circuit 302 of UNIT2. The wirings for the other two UNIT's are similar for UNIT1.

In the wiring shown in FIG. 5, the electrical connection between each nonlinear oscillator unit can be cut off by setting the impedance of the variable resistors 34 and 35 to infinity. Adjustment of the phase of each nonlinear oscillator unit is made by adjusting the variable resistors 30 to 33 through an external circuit S. In order to couple the respective nonlinear oscillator units as shown in FIG. 1 with their oscillation set to the desired phase, the impedance of the variable resistors 34 and 35 is adjustable from infinity to a finite predetermined value.

If one oscillator unit is isolated and if a phase shift signal $\phi$ is externally applied to the isolated oscillator unit, the phase of the output signal of this oscillator unit is shifted by an angle $\phi$, but the output signal of the nonlinear oscillator of that oscillator unit is not shifted. If two such nonlinear oscillator units are connected in a linear form (which is not a loop-coupling) and if the front unit is phase-shifted, the output signal of the rear unit is shifted by the angle $\phi$. In other words, $\phi$ is the phase difference between the phase PA of the nonlinear oscillator of the front unit and the phase PB of the nonlinear oscillator of the rear unit. From this view point, the amount $\phi_{ji}$ of phase shift may be called the "phase difference" between nonlinear oscillators. However, the present invention is, as described above, directed not only to the "consistent" state but also "frustrated" state and, since this "frustrated" state brings about $Pj-Pi\neq\phi_{ij}$, it is not appropriate to refer to the amount $\phi_{ji}$ of phase shift as phase difference in all cases.

The foregoing is a description of the principle of the present invention, and the nonlinear oscillator system, shown in FIGS. 1 and 5, which are constructed by using three oscillator units and has been referred to for the purpose of explanation. FIGS. 1 and 5 are general block diagrams showing conceptual models which serve to facilitate understanding the concept of the present invention. The present invention will now be described in more detail with reference to specific embodiments (first to third embodiments).

First Embodiment

Figure 6:
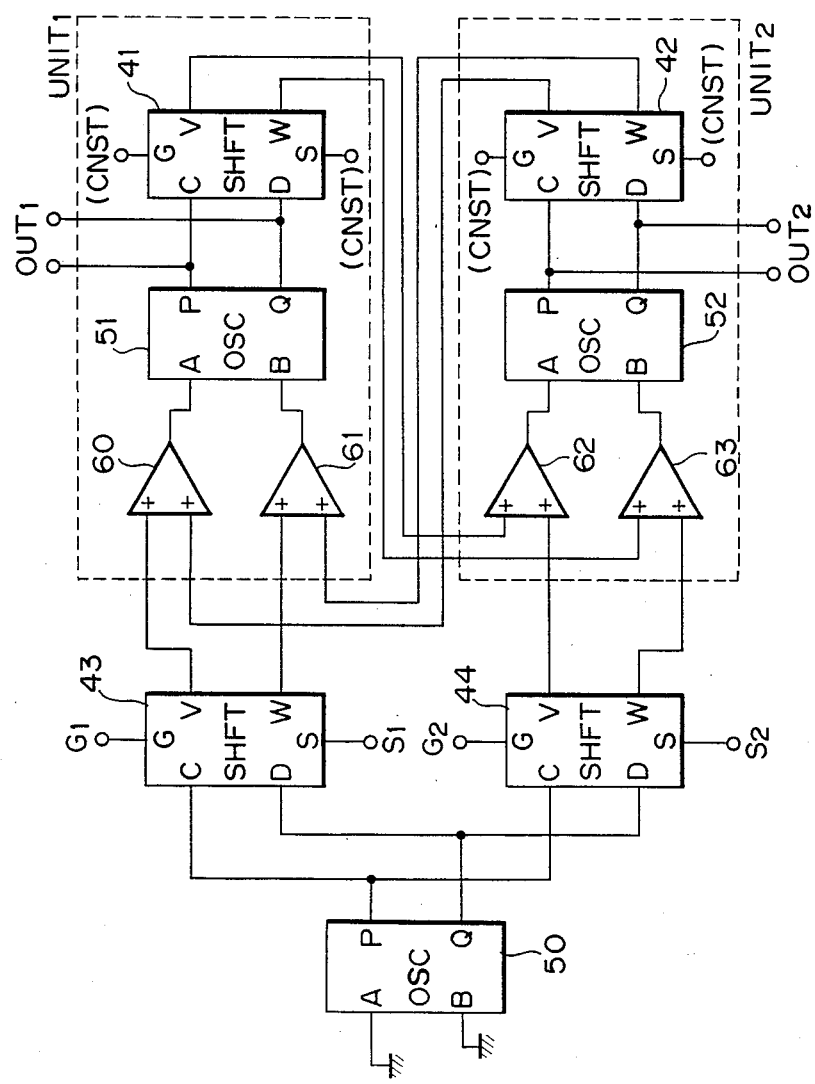
FIG. 6 is a schematic diagram showing a first embodiment of the signal processing apparatus in which three nonlinear oscillators are coupled.

FIG. 6 is a block diagram showing a first embodiment of a signal processing circuit which consists of a plurality of oscillator units each of which is constructed by a combination of an oscillator, a phase shift circuit and adders. As illustrated, an oscillator 51 and an oscillator 52 are connected to each other through phase shift circuits 41 and 42 to form a loop. The outputs of an oscillator 50 are connected to phase shift circuits 43 and 44, respectively. The outputs of the phase shift circuit 43 and corresponding outputs of the phase shift circuit 42 are added in adders 60 and 61, and the results are inputs to the oscillator 51. The outputs of the phase shift circuit 44 and corresponding outputs of the phase shift circuit 41 are added in adders 62 and 63, and the results are inputs to the oscillator 52. The oscillator 51 and the phase shift circuit (SHFT) 41 constitute UNIT1, while the oscillator 52 and the phase shift circuit (SHFT) 42 constitute UNIT2.

The inner parameters of each of the oscillators 50, 51 and 52 are adjusted in advance so that the proper frequencies of the oscillators (the basic frequencies of these oscillators before coupling) equal one another.

In the embodiment shown in FIG. 6, the following setting is carried out. Of the coupling strengths $g_{ij}$ between the respective oscillators explained in connection with FIG. 1, neither a coupling strength $g_{23}$ nor a coupling strength $g_{13}$ is input to the oscillator 50, whereby the oscillator 50 is fixed to "0". In addition, the inputs S and G of each of the phase shift circuits 41 and 42 are fixed so that the following conditions are satisfied $$\phi_{12} - \phi_{21} = 0$$

$$g_{12} = g_{21} = \text{(a constant value)}$$

$\phi_{12} - \phi_{21} = 0$ means that there is no difference between the amounts of phase shift in the oscillations which are fed to the units 1 and 2 through the inputs S of the phase shift circuits 41 and 42, respectively.

In the embodiment of the signal processing apparatus of FIG. 6, an input signal to be processed by the apparatus is a signal Sk which is input to the terminals S of the respective phase shift circuits 43 and 44. In this circuit, the external inputs $\phi_{31}$ and $\phi_{32}$ can be made variable by the application of an input signal, while an external adjustment input Gk is maintained at $g_{32} = g_{31} = $ a constant value. That is, the external inputs $\phi_{31}$ and $\phi_{32}$ which are adjusted by the signal Sk (k=1, 2) are input signals applied to the oscillator system.

Figure 7B:
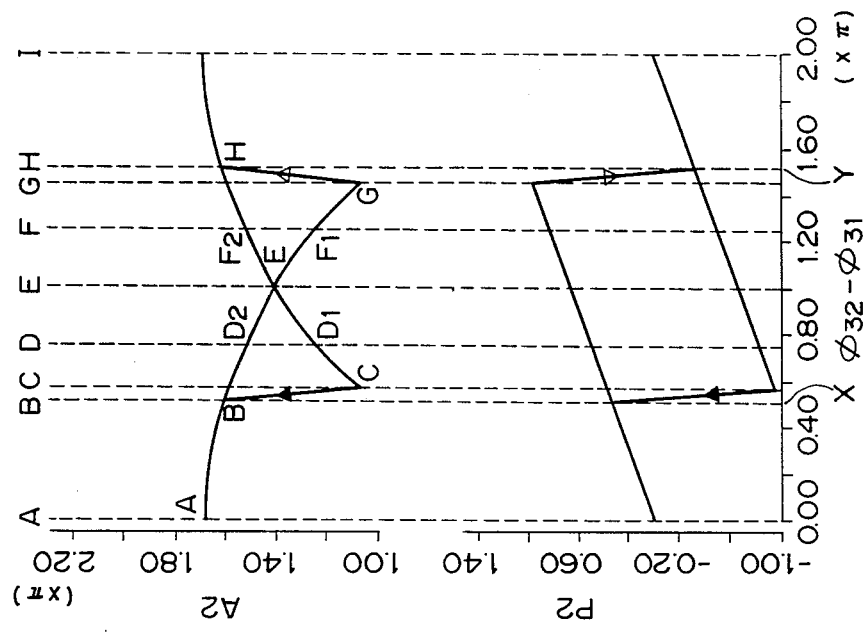
FIGS. 7A and 7B are graphs each of which shows the conversion characteristics between an input (the difference in phase shift between two nonlinear oscillators) and output signals (amplitude and phase) which are provided by the first, second and third embodiments of the apparatus.
Figure 7A:
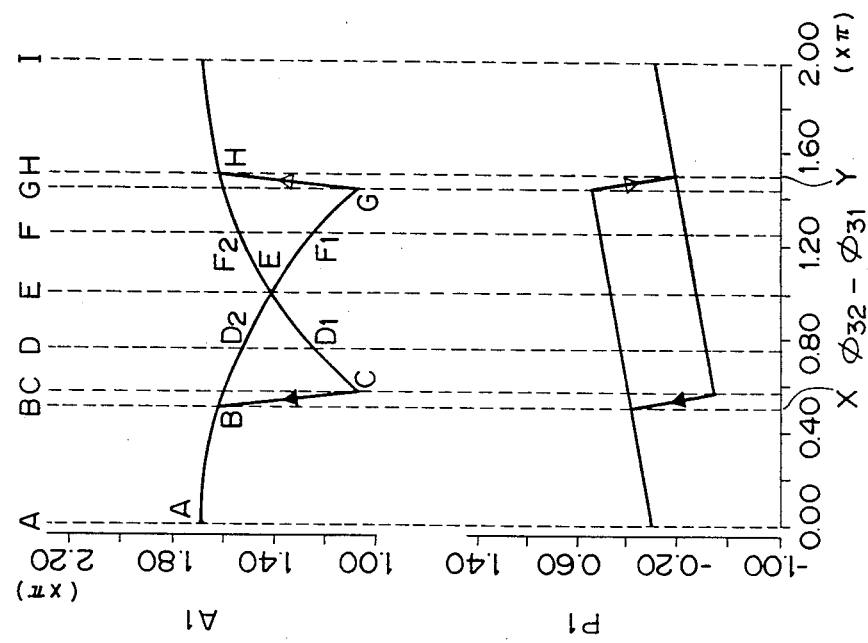

FIG. 7A is a graph showing the relationship between the amplitude A1 and the phase P1 in a steady state which are provided at the output terminals P and Q of the oscillator 51 when the external inputs $\phi_{31}$ and $\phi_{32}$ are varied by adjustment of the signal Sk. FIG. 7B is a graph showing the relationship between an amplitude A2 and a phase P2 in a steady state which are provided at the output terminals P and Q of the oscillator 52 when the external inputs $\phi_{31}$ and $\phi_{32}$ are varied by adjustment of the signal Sk. In these figures, the respective horizontal axes represent not the absolute values of $\phi_{32}$ and $\phi_{31}$ but a difference $\phi_{32} - \phi_{31}$. This is because even if the absolute values of $\phi_{32}$ and $\phi_{31}$ change, it does not lead to change in the shape of the graph shown in FIG. 7 and merely influences the movement of values along axes P1 and P2 in the respective graphs and also the use of difference $\phi_{32} - \phi_{31}$ does not degrade generality.

The characteristics of signal processing executed by the embodiment of the signal processing apparatus which is shown in FIG. 6 is explained below with reference to FIGS. 7A and 7B.

In FIGS. 7A and 7B, the difference $\phi_{32} - \phi_{31}$ takes on 0 and $2\pi$ point A and I, respectively. At points A and I, $\phi_{32} + \phi_{21} + \phi_{13} = 2n\pi$ is obtained, that is, the oscillator system is in the "consistent" state. It is theoretically possible for the difference $\phi_{32} - \phi_{31}$ to take on any arbitrary values between $-2n\pi$ and $2n\pi$, and even if $\phi_{32} - \phi_{31} \geq 2\pi$ or $\phi_{32} - \phi_{31} \leq 0$, the graphic representation shown in FIGS. 7A and 7B repetitives.

At any point other than point A, the difference $\phi_{32} - \phi_{31}$ becomes $\phi_{32} - \phi_{31} \neq 0$ and, as the difference $\phi_{32} - \phi_{31}$ becomes large, that is, as the difference $\phi_{32} - \phi_{31}$ approaches point G, amplitudes A1 and A2 become small. When $\phi_{32} - \phi_{31}$ reaches point G, amplitudes A1 and A2 stop decreasing and abruptly increase after point G, and continues to increase until $\phi_{32} - \phi_{31}$ reaches point H. If $\phi_{32} - \phi_{31}$ starts to decrease at point H, amplitudes A1 and A2 decrease until point C is reached. After point C has been passed, amplitudes A1 and A2 abruptly increase and continue to increase until point B is reached. If it is assumed that the difference $\phi_{32} - \phi_{31}$ oscillates between X and Y in FIGS. 7A and 7B, the oscillator system draws a hysteresis loop of B→D2→E→F1→G→H→F2→E→D1→C→B, exhibiting a bi-stable state. This tendency to draw the bi-stable hysteresis loop applies to the phase differences P1 and P2 as well.

It is concluded that the extent of the region of bi-stable state can be adjusted by changing the values of $g_{ij}$.

With the circuit of FIG. 6 which has the above-described characteristic, it is possible to modulate the output amplitudes A1 and A2 and the output phases P1 and P2 in accordance with the magnitude of the difference $\phi_{32} - \phi_{31}$.

This modulation does not merely reflect input phase difference but also can reflect the past states of the oscillator system due to the presence of hysteresis. In the embodiment, at point D or F, the amplitude and the phase of the output can assume two kinds of states, depending upon the past state of the oscillator system. In addition, if the value of amplitude at point E is specified as a threshold and the states of amplitudes at point D or F are respectively assigned to, for example, "1" and "0" for processing purposes, the amplitude of the output analog signal can be switched on and off by changing the difference $\phi_{32} - \phi_{31}$.

In addition, the phases P1 and P2 of the outputs of the oscillators of UNIT1 and UNIT2 can take on two different values by controlling the past hysteresis and the input $\phi_{32} - \phi_{31}$.

In addition, the phase difference P2−P1 between two oscillators takes on two different values. For example, suppose that for the case of $g_{12} = g_{21} = g_{31} = g_{32}$, the relationship between P2−P1 and $\phi_{32} - \phi_{31}$ is plotted with P2 −P1 and $\phi_{32} - \phi_{31}$ used to enter the respective vertical and horizontal axes. It will show us that the value of P2−P1 can be bi-value within the range of the above bi-stable state regarding amplitude A and phase P. That is, the value of P2−P1 can be $\frac{1}{2}(\phi_{32} - \phi_{31}) + 2n\pi$ and also can be $\frac{1}{2}(\phi_{32} - \phi_{31}) - \frac{2}{3}\pi + 2n\pi$. This indicates that modulation and switching of the phase difference P2−P1 of an oscillation output can be obtained by controlling $\phi 32 - \phi 31$.

Figure 11A:
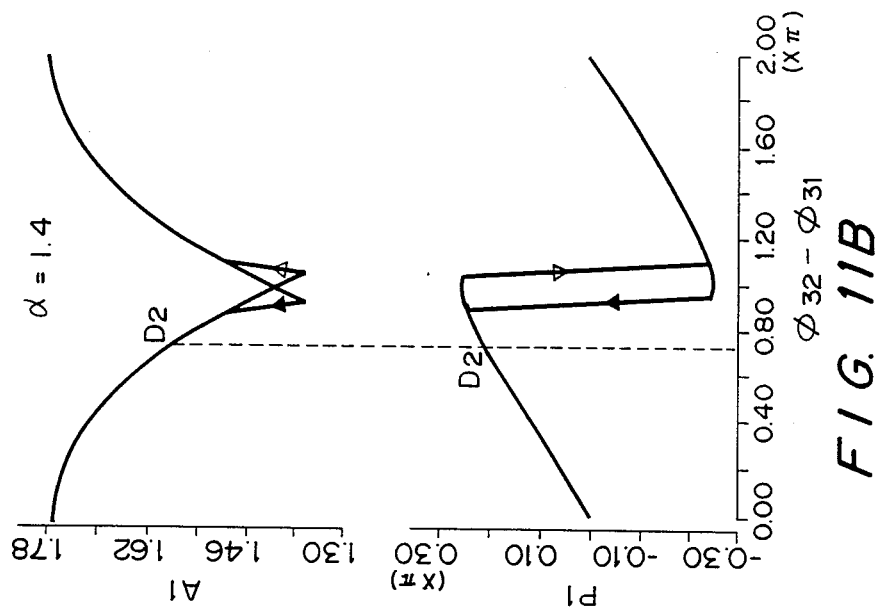
FIGS. 11A and 11B are graphs showing the conversion characteristics when $\alpha=0.6$ and $1.4$, respectively.
Figure 11B:
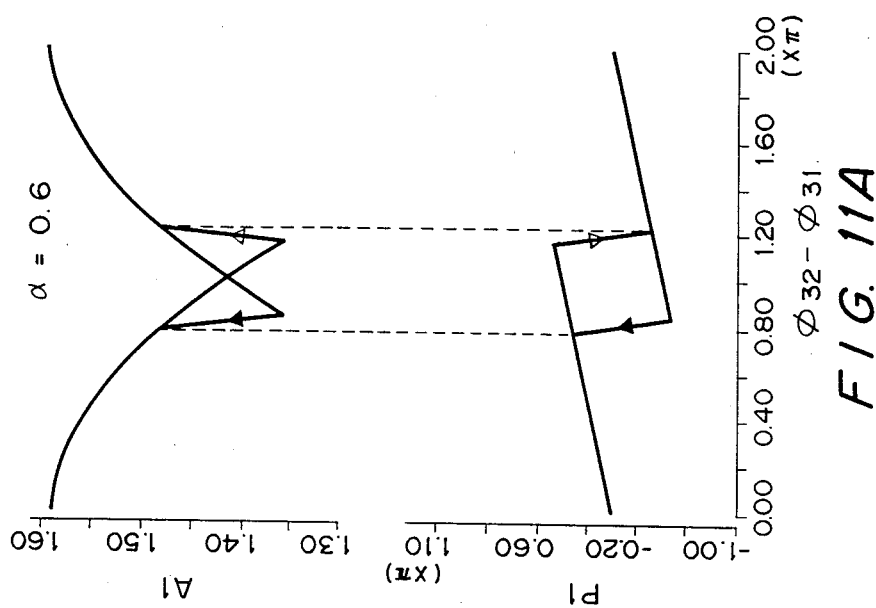

In addition, if the ratio $\alpha$ is defined as:

$$\alpha = \frac{\beta_2}{\beta_1}$$

where $g12=g21=\beta 1$ and $g32=g31=\beta 2$, and is controlled (i.e., increased or decreased) while $\phi 32 - \phi 31$ is being held constant by adjusting the inputs Gk and Sk (k=1, 2) of the circuit of FIG. 6, it is possible to reduce the extent of the bi-stable region while maintaining the symmetry characteristic on the opposite sides of point E. FIGS. 11A and 11B are graphs showing amplitude A1 and phase P1 for $\alpha=0.6$ and $=1.4$, respectively. FIGS. 7A and 7B show an example of $\beta 2/\beta 1=1$. Suppose that at point D in FIG. 7A, the system is in a D1 state where the amplitude is small. Transition point B can be moved between point D and point E by changing the value of $\alpha$. For example, if the value of $\alpha$ is changed to 1.4, the system will transfer to the mono-stable state D2 as shown in FIG. 11B. Thus, the movement of the transition point B enables the system to be switched from the D1 state to a D2 state where the amplitude is large. It is likewise possible to apply the above-described movement of the transition point B to the switching modulation of the phase signals P1 and P2 and the phase difference signals P1−P2.

Second Embodiment

Figure 8:
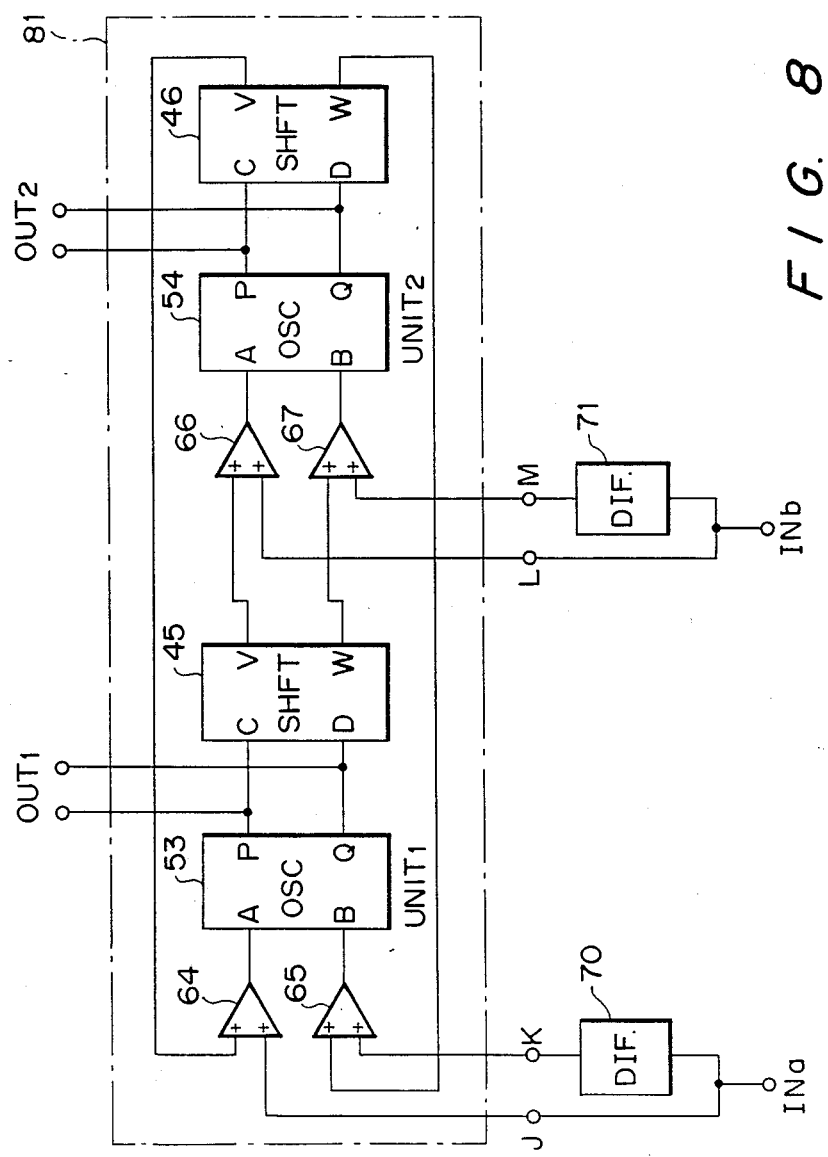
FIG. 8 is a schematic diagram of the second embodiment of the signal processing apparatus according to the present invention.

FIG. 8 shows a second embodiment of the signal processing apparatus in accordance with the present invention. The input of this embodiment is two nonlinear oscillation waves. These oscillation waves are applied to nonlinear oscillator units UNIT1 and UNIT2 through terminals INa and INb, respectively. UNIT1 consists of adders 64, 65, an oscillator OSC and a phase shift circuit SHFT 45. UNIT2 consists of adders 66, 67, an oscillator OSC 54 and a phase shift circuit SHFT 46. The UNIT1 and UNIT2 are coupled to each other with a predetermined coupling strength. In the figure, the signal path extending from each of the input terminals INa and INb branches into two separate signal paths. One of the two signal paths from the input terminal INa is connected directly to a terminal J, while the other signal path is connected to a terminal K through a differentiation circuit 70. Similarly, one of the two signal paths from the input terminal INb is connected directly to a terminal L, while the other signal path is connected to a terminal M through a differentiation circuit 71.

If the signals provided at the output terminals P and Q of each of the units UNIT1 and UNIT2 are monitored at a corresponding terminal OUT1 or OUT2, respectively, the relationships between the output amplitude A1 and the phase P1 of UNIT1 and between the output amplitude A2 and the phase P2 of UNIT2 with respect to $\phi 32 - \phi 31$ are identical to the result provided by the first embodiment (FIGS. 7A and 7B), where $\phi 31$ is the phase difference between the oscillation waveform of OSC 53 and the input (INa) of the UNIT1 and $\phi 32$ is the phase difference between the oscillation waveform of OSC 54 and the input (INb) of UNIT2.

The apparatus of FIG. 8 is arranged to effect direct modulation switching of a signal on the basis of the respective relationships between the two output oscillation waveforms OUT1 and OUT2 of the oscillation system and the two input oscillation waveforms INa and INb, rather than by means of the external adjustment inputs Gk and Sk used in the first embodiment. In this apparatus, the output oscillation is obtained by conversion of the input oscillation. The apparatus of FIG. 8 may be utilized as a modulator-converter for handling the phase relationship between, or the amplitudes and phase of, two oscillations. In addition, the apparatus of FIG. 8 may be adapted to modulation which allows for the hysteresis of each UNIT1 and UNIT2 by varying an input which is utilized as a control signal.

As one modification of the embodiment shown in FIG. 8, the differentiation circuits 70 and 71 may be omitted, and instead integrator circuits may be used in the signal paths connected to the respective terminals J and K. In this arrangement, each of the input oscillation waveforms INa and INb is divided into two parts, and one part of each waveform INa and INb is applied directly to the terminal K or M, while the other part is applied to the terminal J or L through the corresponding integrator circuit.

Third Embodiment

Figure 9:
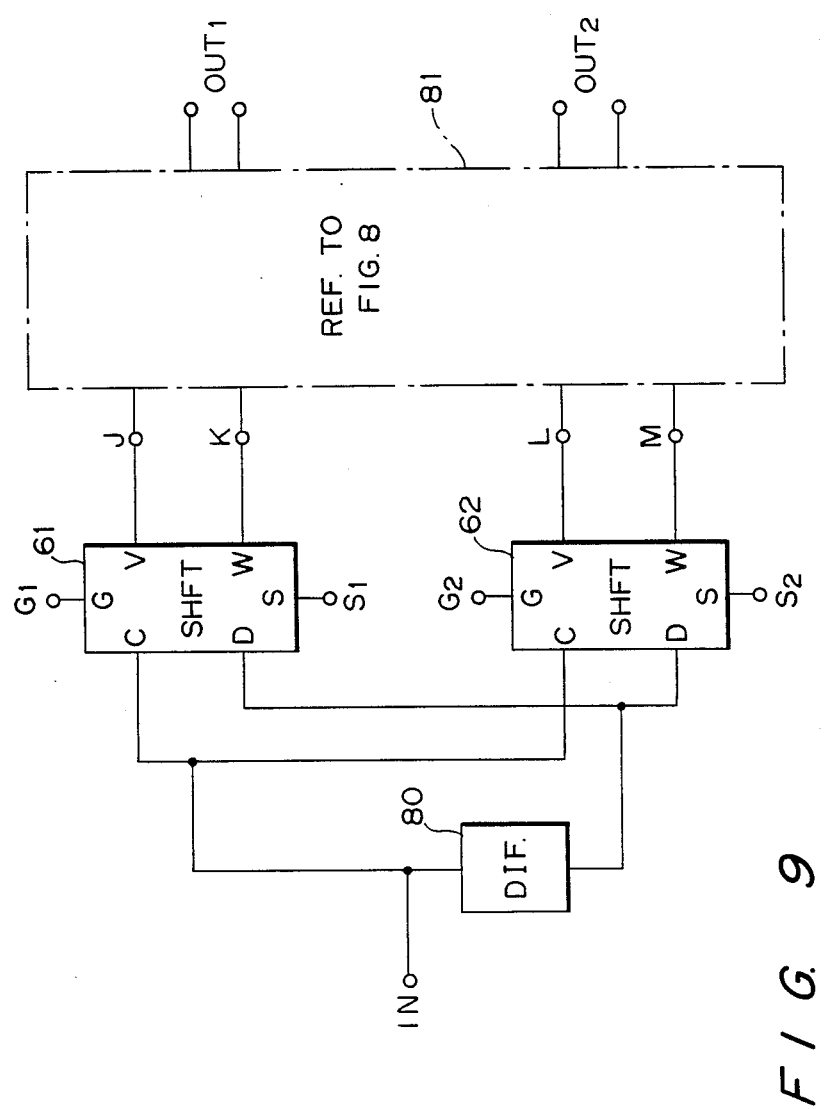
FIG. 9 is a schematic diagram of the third embodiment of the signal processing apparatus according to the present invention.

A third embodiment is designed to achieve effects similar to those of the first and second embodiments by using a single oscillation waveform input. FIG. 9 is a circuit diagram showing the third embodiment of a signal processing apparatus. In the figure, the construction of the nonlinear oscillator circuit system 81 is identical to the circuit portion 81 surrounded by a one-dot chain line in FIG. 8.

After a single oscillation waveform has been applied to the apparatus of FIG. 9 through an input terminal IN, the oscillation waveform is transmitted through phase shift circuits 61 and 62 to the circuit system 81 constructed of two nonlinear oscillators. Each of the phase shift circuits 61 and 62 serve to shift the phase of the input oscillation waveform in response to the external adjustment inputs Sk and Gk (k=1, 2) supplied from an external circuit and to adjust the phase difference between the input signal IN and the oscillation of the oscillator OSC 53 in the circuit system 81 to the amount $\phi 31$ of phase shift and, at the same time, adjust the phase difference between the input signal IN and the oscillation of the oscillator OSC 54 in the circuit system 81 to the amount $\phi 32$ of phase shift.

The relationships between the resultant difference $\phi 31 - \phi 32$ and the amplitude A1 and the phase P1 of the oscillation of the oscillator OSC 53 and between the difference $\phi 31 - \phi 32$ and the amplitude A2 and the phase P2 of the oscillation of the oscillator OSC 54 are the same as the relationships shown in FIGS. 7A and 7B.

The third embodiment is arranged to effect modulation switching of its output in accordance with the relationships between the single input oscillation IN, the external adjustment input Sk or Gk and the oscillation of the two internal oscillators. This circuit arrangement is capable of controlling a signal input oscillation to effect modulation or switching of the amplitudes and the phases of the two oscillations or the relationship between the phases of the two oscillations. In addition, the third embodiment can be utilized as a converter which can convert a single oscillation into two oscillations each having a different phase which reflects the state of the single oscillation.

Effects of the Embodiments

Each of the above three embodiments employs, as a signal processing mode, the "entrainment" caused by the interaction between oscillators. Accordingly, the above embodiments can be adapted to conventional types of analog processing as ell as digital processing employing the hysteresis characteristic aforementioned.

In addition, the above embodiments make it possible to carry out the signal processing for converting phase difference serving as an information carrier into the magnitude of amplitude by means of mutual interference. Accordingly, it is possible to realize conversion or modulation switching of amplitude, phase or phase relationship and therefore to design an analog sequence machine or storage apparatus capable of producing an output which reflects the hysteresis of the system.

Furthermore, according to the above embodiments, it is possible to design different signal processors by using a single circuit and further to extend the capability of processing by combining various basic circuit blocks with one another or by combining the basic circuit blocks with conventional types of signal processing which employs "entrainment" as its basic mode.

Modifications of the Embodiment

It is possible to modify the above embodiments without departing from the scope and spirit of the present invention.

For example, it is apparent that more complicated and higher-level signal processing can be designed by various combinations of the first, second and third embodiments.

In addition, the bi-stable state having hysteresis which is realized in each of the three embodiments can be adapted as a memory, an arithmetic-logic unit, a waveform shaping unit, an amplifier or the like. FIG. 10 shows a block diagram for identifying, in a binary manner, the state of oscillation appearing at each of the outputs OUT1 and OUT2 of a single memory device which is constituted by the above-described three nonlinear oscillator systems. In other words, if the nonlinear oscillator systems of the above embodiments are compared to a memory device, the diagram of FIG. 10 is equivalent to a sense amplifier of the type used in conventional IC memories.

In each of the above embodiments, a Van der Pol oscillator circuit having stable basic oscillation characteristics is employed as a circuit for each oscillator unit since the Van der Pol oscillator circuit has highly reliable waveform stability. However, the circuits of the respective oscillator units may be realized by utilizing various other types of nonlinear circuits, digital circuits capable of computing nonlinear oscillation, or any other optical, mechanical, or chemical means capable of generating nonlinear oscillation. More specifically, instead of electrical circuit elements, optical elements or chemical elements utilizing the potential oscillation of film may be used as nonlinear oscillators.

What is claimed is:

1. A signal processing apparatus for analog conversion, modulation or storage of an input signal, comprising:
   N nonlinear oscillators;
   coupling means for coupling said N nonlinear oscillators in a loop-like configuration;
   shifting means for shifting the phase of the output signal of a particular nonlinear oscillator from among said N nonlinear oscillators in correspondence with an input signal; and
   outputting means for outputting the output of at least one oscillator of said N nonlinear oscillators as the output of said signal processing apparatus.

2. A signal processing apparatus according to claim 1, wherein each of said nonlinear oscillators is constituted by a Van der Pol oscillator circuit.

3. A signal processing apparatus according to claim 1, wherein if the amount of phase shift of the output signal of i-th nonlinear oscillator, where the shifted output signal is fed to the j-th nonlinear oscillator, is represented by $\phi ij$, then $$\sum_{i=1}^{N} \phi_{i,i+1} \neq 2n\pi, \text{ or } \sum_{i=2}^{N+1} \phi_{i,i-1} \neq 2n\pi$$

(where $n$ is an integer number)

4. A signal processing apparatus according to claim 1, wherein said signal processing apparatus further includes comparing means for comparing a signal output from said output means with a predetermined threshold and then for providing a binary output.

5. A signal processing apparatus according to claim 1, wherein said outputting means outputs the amplitude of oscillation as information.

6. A signal processing apparatus according to claim 1, wherein said outputting means outputs the phase of oscillation as information.

7. A signal processing apparatus according to claim 1, wherein said coupling means includes altering means for altering the strength of coupling between said nonlinear oscillators, the characteristics of modulation or conversion of said signal processing apparatus being controlled by altering said strength by said altering means.

* * * * *

UNITED STATES PATENT AND TRADEMARK OFFICE
CERTIFICATE OF CORRECTION

PATENT NO. : 4,982,170
DATED : January 1, 1991
INVENTOR(S) : SATOSHI OMATA ET AL.

Page 1 of 2

It is certified that error appears in the above-identified patent and that said Letters Patent is hereby corrected as shown below:

COLUMN 4

Line 54, "BASIC CONSTRUCTION OF THE" should read --Basic Construction of the--.
Line 55, "EMBODIMENTS" should read --Embodiments--.

COLUMN 6

Line 9, "of" (second occurrence) should be deleted.
Line 18, "2πaccording" should read --2π according--.
Line 36, "$Ai = d \cdot Ai - e \cdot Ai^3 + \sum_{j} \{gji \cdot COS(\phi ji + Pj - Pi)\}$ (5)" should read --$Ai = d \cdot Ai - e \cdot Ai^3 + \sum_{j} \{gji \cdot Aj \cdot COS(\phi ji + Pj - Pi)\}$ (5)--.

COLUMN 8

Line 45, "exits" should read --exists--.

UNITED STATES PATENT AND TRADEMARK OFFICE
CERTIFICATE OF CORRECTION

PATENT NO. : 4,982,170

DATED : January 1, 1991

INVENTOR(S) : SATOSHI OMATA ET AL.

It is certified that error appears in the above-identified patent and that said Letters Patent is hereby corrected as shown below:

COLUMN 15

Line 7, "ell" should read --well--.
    Line 25, "Embodiment" should read --Embodiments--.

Signed and Sealed this

First Day of December, 1992

Attest:

DOUGLAS B. COMER

Attesting Officer      Acting Commissioner of Patents and Trademarks